(12) United States Patent
Chiu et al.

(10) Patent No.: US 10,410,970 B1
(45) Date of Patent: Sep. 10, 2019

(54) ELECTRONIC PACKAGE AND METHOD FOR FABRICATING THE SAME

(71) Applicant: Siliconware Precision Industries Co., Ltd., Taichung (TW)

(72) Inventors: Chih-Hsien Chiu, Taichung (TW); Chia-Yang Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/993,108

(22) Filed: May 30, 2018

(30) Foreign Application Priority Data

Mar. 6, 2018 (TW) .............................. 107107457 A

(51) Int. Cl.
| | | |
|---|---|---|
| *H01L 23/552* | (2006.01) | |
| *H01L 23/538* | (2006.01) | |
| *H01L 23/00* | (2006.01) | |
| *H01L 25/10* | (2006.01) | |
| *H01L 21/48* | (2006.01) | |
| *H01L 21/56* | (2006.01) | |
| *H01L 25/00* | (2006.01) | |
| *H01L 23/31* | (2006.01) | |

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3114* (2013.01); *H01L 23/5383* (2013.01); *H01L 23/5386* (2013.01); *H01L 23/552* (2013.01); *H01L 24/19* (2013.01); *H01L 24/20* (2013.01); *H01L 25/105* (2013.01); *H01L 25/50* (2013.01); *H01L 2224/214* (2013.01); *H01L 2225/1035* (2013.01); *H01L 2225/1058* (2013.01); *H01L 2924/3025* (2013.01)

(58) Field of Classification Search
CPC ............... H01L 21/4853; H01L 21/565; H01L 21/4857; H01L 23/5389; H01L 23/5386; H01L 23/3114; H01L 23/5383; H01L 23/552; H01L 24/19; H01L 24/20; H01L 25/105; H01L 25/50
USPC ........................................................ 257/659
See application file for complete search history.

(56) References Cited

U.S. PATENT DOCUMENTS

| 8,349,658 | B2* | 1/2013 | Chi ..................... H01L 21/4832 257/666 |
| 8,409,922 | B2* | 4/2013 | Camacho ............ H01L 21/4853 257/673 |
| 9,875,970 | B2* | 1/2018 | Yi ........................ H01L 23/5389 |
| 9,899,303 | B2* | 2/2018 | Chen .................. H01L 23/49811 |
| 9,922,896 | B1* | 3/2018 | Cheng ..................... H01L 24/03 |
| 9,978,715 | B2* | 5/2018 | Huang .................... H01L 24/97 |

* cited by examiner

*Primary Examiner* — Luan C Thai
(74) *Attorney, Agent, or Firm* — Mintz Levin Cohn Ferris Glovsky and Popeo, P.C.; Peter F. Corless; Steven M. Jensen

(57) ABSTRACT

An electronic package is provided. An electronic component and a plurality of conductive pillars are provided on a carrier structure. An encapsulation layer encapsulates the electronic component and the conductive pillars. Each of the conductive pillars has a peripheral surface narrower than two end surfaces of the conductive pillar. Therefore, the encapsulation layer is better bonded to the conductive pillars. A method for fabricating the electronic package is also provided.

19 Claims, 10 Drawing Sheets

ELECTRONIC PACKAGE AND METHOD FOR FABRICATING THE SAME

CROSS-REFERENCE TO RELATED APPLICATION

This Application claims priority under 35 U.S.C. § 119(a) the benefit of Taiwanese Patent Application 107107457 filed on Mar. 6, 2018, the entire contents of which is incorporated herein by reference in its entirety.

BACKGROUND

1. Technical Field

The present disclosure relates to semiconductor fabricating processes, and, more particularly, to an electronic package and a method for fabricating the same.

2. Description of Related Art

With the evolution of semiconductor package technology, various kinds of packaging techniques for semiconductor devices have been developed. In order to improve electrical functionalities and save packaging space, a packaging method called Package on Package (POP) has been created by stacking a plurality of packaging structures. Such a packaging method heterogeneously integrates electronic components of different functionalities (e.g., a memory, a CPU, a graphics processor, an image application processor, etc.) to form a System in Package (SiP). System integration is achieved by stacking and is suited for various small and light electronic products.

FIG. 1 is a cross-sectional schematic diagram of a traditional packaging stacking structure 1. The packaging stacking structure 1 includes a first packaging substrate 11 and a second packaging substrate 12. The first packaging substrate 11 includes a first surface 11a and a second surface 11b opposite to the first surface 11a. A semiconductor component 10 is provided on the first surface 11a and electrically connected with the first packaging substrate 11. Ball pads 112 are provided on the second surface 11b for attaching solder balls 17 thereon. The second packaging substrate 12 includes a third surface 12a and a fourth surface 12b. A plurality of electrical contact pads 120 are provided on the third surface 12a. Solder resist layers 123 are also provided on the third surface 12a and the fourth surface 12b. The electrical contact pads 120 are exposed from a plurality of openings in the solder resist layer.

During manufacturing, the semiconductor component 10 is electrically connected with the first packaging substrate 11 in a flip-chip method. An underfill 16 is filled between the semiconductor component 10 and the first packaging substrate 11, and a plurality of solder balls 13 are disposed on the first surface 11a of the first packaging substrate 11. The second packaging substrate 12 is then stacked on top of and electrically connected with the first packaging substrate 11 with its fourth surface 12b via the solder balls 13. Next, an encapsulant 14 is formed between the first surface 11a of the first packaging substrate 11 and the fourth surface 12b of the second packaging substrate 12 to encapsulate the semiconductor component 10 and the solder balls 13. Then, a plurality of second semiconductor components 15 are provided on the third surface 12a in the flip-chip method to electrically connect with the electrical contact pads 120. An underfill 16 is filled between the second semiconductor components 15 and the second packaging substrate 12.

In the method for fabricating the traditional packaging stacking structure 1, the solder balls 13 are used as the supports and electrical connections between the first packaging substrate 11 and the second packaging substrate 12, and the solder balls 13 have certain widths. However, as the number of I/O contacts in an electronic product keeps increasing, the pitch between the solder balls 13 needs to be smaller with the same packaging size. As a result, a phenomenon called bridging will occur more often, resulting in poor product yield and reliability. Fine pitch between the solder balls 13 is therefore difficult to achieve.

Moreover, the solder balls 13 are usually formed on the first packaging substrate 11 by ball placing or screen printing. The solder bumps 13 after being reflowed may have large variations in terms of their volumes and heights. The contacts are prone to defects, and in turn poor electrical connections. In addition, a grid array formed by these solder balls 13 tends to have poor co-planarity, causing unbalanced contact stress and leading to tilted first packaging substrate 11 and the second packaging substrate 12, or even contact offsets.

Therefore, there is a need for a solution that addresses the aforementioned issues in the prior art.

SUMMARY

In view of the aforementioned shortcomings of the prior art, the present disclosure provides an electronic package, which may include: a carrier structure; at least one electronic component provided on and electrically connected with the carrier structure; a plurality of conductive pillars provided on the carrier structure, wherein the conductive pillars each include two opposite end faces and a peripheral surface adjoining the two end faces and being narrower than the two end faces; and at least one encapsulation layer encapsulating the electronic component and the conductive pillars.

The present disclosure further includes a method for fabricating an electronic package, which may include: providing a conductive frame including a plate and a plurality of conductive pillars connected with the plate, wherein the conductive pillars each include two opposite end faces and a peripheral surface adjoining the two end faces and being narrower than the two end faces; bonding onto a carrier structure at least one electronic component and the conductive frame via the conductive pillars; encapsulating the electronic component and the conductive pillars with at least one encapsulation layer; and removing the plate.

In an embodiment, the conductive frame is formed by removing a portion of a metal plate to form recesses that separate the conductive pillars.

In an embodiment, the conductive pillars are electrically connected with the carrier structure.

In an embodiment, the conductive pillars are bonded onto the carrier structure via a plurality of conductors.

In an embodiment, the carrier structure includes a first side and a second side opposite to the first side, and the electronic components are provided on both the first side and the second side.

In an embodiment, the carrier structure includes a first side and a second side opposite to first side, and the encapsulation layers are provided on both the first side and the second side.

In an embodiment, a portion of a surface of the electronic component is exposed from a surface of the encapsulation layer.

In an embodiment, the conductive frame further includes a bonding pad at a location corresponding to the location of the electronic component and at least partially exposed from the encapsulation layer.

In an embodiment, a shielding element shields the electronic component.

In an embodiment, after the plate is removed, a wiring structure is formed on the encapsulation layer and is electrically connected with the conductive pillars or the electronic component.

As can be understood from the above, the electronic package and the method for fabricating the same according to the present disclosure replace traditional solder balls with conductive pillars of the conductive frame, which allows the pitch of the conductive pillars to be adjusted according to the need. Compared to the prior art, the present disclosure alleviates bridging across the conductive pillars, thereby raising product yield and reliability and satisfying the need for fine pitch.

Furthermore, the method for fabricating the electronic package according to the present disclosure includes forming the conductive frame before attaching it onto the carrier structure. Thus, compared to the prior art, the fabricating method according to the present disclosure is capable of obtaining conductive pillars of uniform height, resulting in good co-planarity of the grid array formed by the conductive pillars, thereby eliminating contact offsets in the subsequent manufacturing process.

In addition, the conductive pillar has two opposite end faces and a peripheral surface adjoining the two end faces and being narrower than the end faces in that the sidewalls of the conductive pillars curve inwards to accommodate the first encapsulation layer, thereby providing better bonding. Therefore, the method for fabricating the electronic package according to the present disclosure avoids delamination in the subsequent process due to poor bonding between the first encapsulation layer and the conductive pillars.

DETAILED DESCRIPTION OF THE EMBODIMENTS

Figure 1:
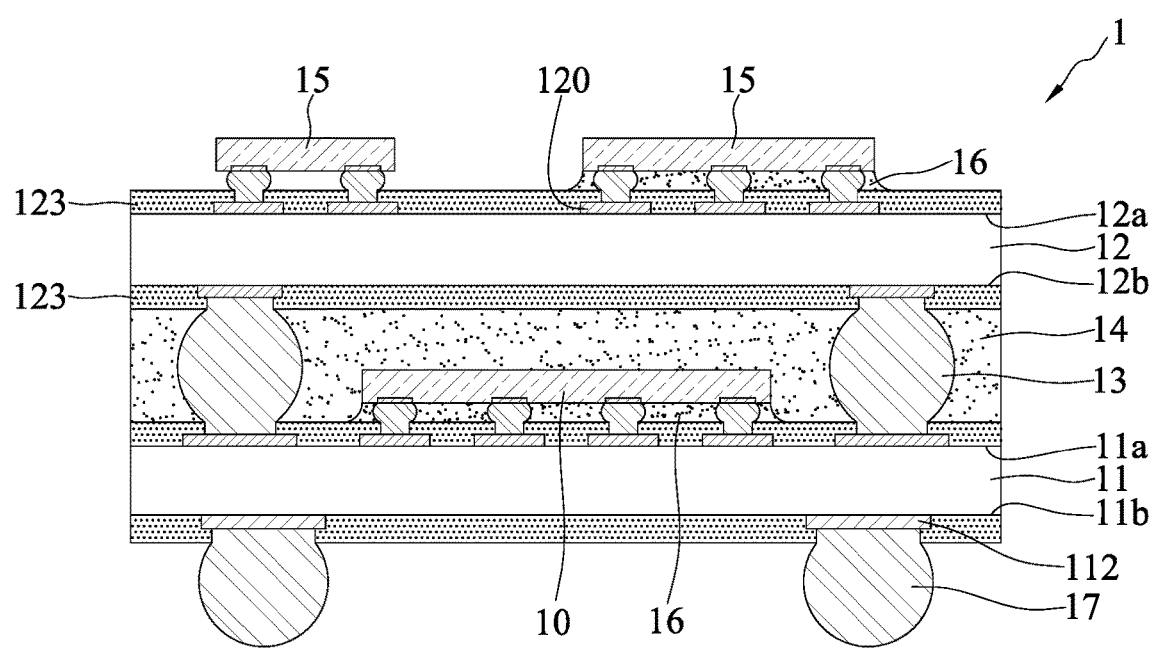
FIG. 1 is a cross-sectional schematic diagram of a traditional packaging stacking structure.

The technical content of present disclosure is described by the following specific embodiments. One of ordinary skill in the art can readily understand the advantages and effects of the present disclosure upon reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "on top of", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Referring to FIGS. 2A to 2E, cross-sectional schematic diagrams depicting a method for fabricating an electronic package 2 in accordance with a first embodiment of the present disclosure are shown.

Figure 2A:
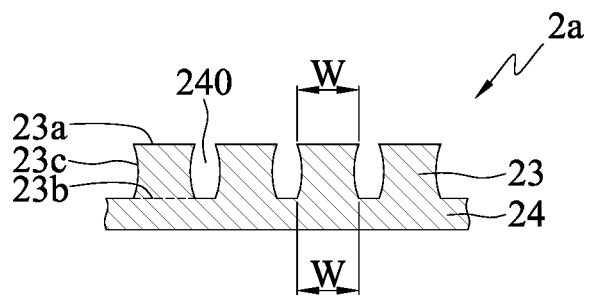
FIGS. 2A to 2E are cross-sectional schematic diagrams depicting a method for fabricating an electronic package in accordance with a first embodiment of the present disclosure.

As shown in FIG. 2A, a conductive frame 2a is provided, including a plate 24 and a plurality of conductive pillars 23 discretely provided on the conductive pillars 23. Each of the conductive pillars 23 includes two end faces 23a and 23b and a peripheral surface 23c adjoining the two end faces 23a and 23b. The width of the peripheral surface 23c is less than the width W of the two end faces 23a and 23b.

In an embodiment, the peripheral surface 23c of the conductive pillar 23 is curved inwards with respect to the two end faces 23a and 23b, so that the width W of the two end faces 23a and 23b is greater than the width of the peripheral surface 23c. The plate 24 and the conductive pillars 23 are formed integrally. In an embodiment, a portion of a metal plate is removed by etching, laser, or other methods to form the conductive frame 2a. In another embodiment, the metal sheet is etched to form undercut recesses 240 that separate the conductive pillars 23, such that the peripheral surfaces 23c of the conductive pillars 23 become concave arcs.

Figure 2B:
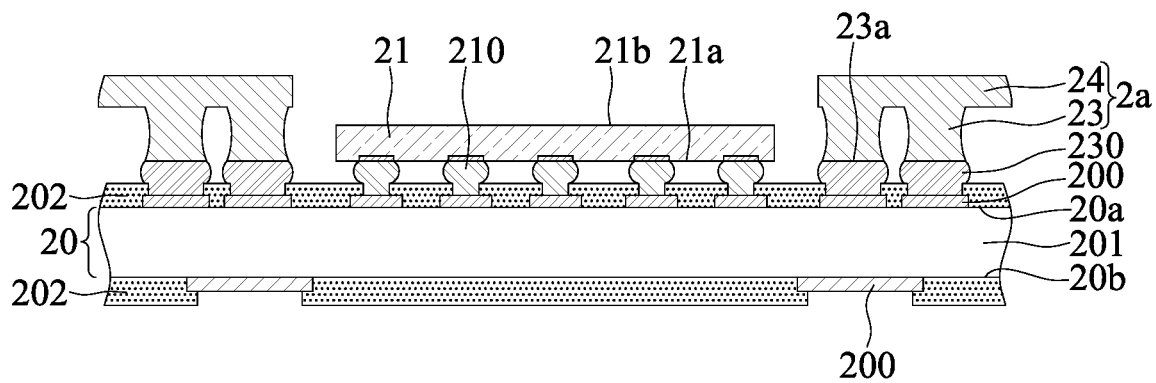

As shown in FIG. 2B, the conductive frame 2a is provided on a carrier structure 20, and at least one first electronic component 21 is provided on the carrier structure 20.

In an embodiment, the carrier structure 20 includes a first side 20a and a second side 20b, and the carrier structure 20 is, for example, a packaging substrate with a core layer and a wiring portion or a coreless packaging substrate with wiring portion. The wiring portion includes at least one insulating layer 201 and a wiring layer 200 provided on the insulating layer 201. In an embodiment, the wiring layer 200 is a fan-out redistribution layer (RDL). Solder resist layers 202 can also be formed on the first side 20a and the second side 20b depending on the need. In an embodiment, the wiring layer 200 can be made of copper, and the insulating layer 201 can be made of a dielectric material, such as polybenzoxazole (PBO), polyimide (PI), prepreg (PP). It can be appreciated that the carrier structure 20 can also be other types of carrier units for carrying electronic components (e.g., chips), such as a leadframe or a silicon interpose, and the present disclosure is not limited as such.

In an embodiment, the first electronic component 21 is provided on the first side 20a of the carrier structure 20. In another embodiment, the first electronic component 21 can be an active element, a passive element, or a combination of both, wherein the active element is, for example, a semiconductor chip, and the passive element is, for example, a resistor, a capacitor, or an inductor. In an embodiment, the first electronic component 21 includes an active face 21a and a non-active face 21b opposite to the active face 21a. The active face 21a is provided on the wiring layer 200 using the flip-chip method via a plurality of conductive bumps 210 (e.g., a solder material) and electrically connected with the wiring layer 200. In another embodiment, the first electronic component 21 can be electrically connected with the wiring layer 200 through a plurality of wires (not shown) by wire bonding. However, the electrical connection between the first electronic component and the carrier structure is not limited to those described above.

Furthermore, the end faces 23a of the conductive pillars 23 of the conductive frame 2a are combined onto the wiring layer 200 on the first side 20a of the carrier structure 20 via conductors 230 (e.g., a solder material).

Figure 2C:
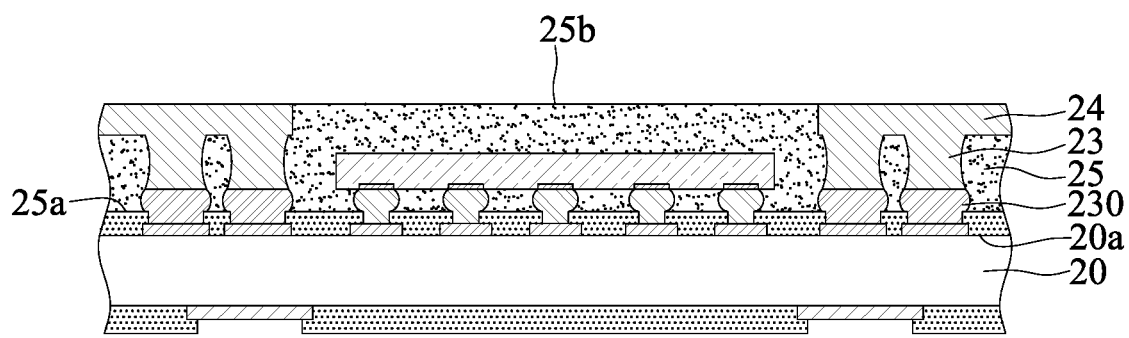

As shown in FIG. 2C, a first encapsulation layer 25 is formed on the first side 20a of the carrier structure 20 to encapsulate the first electronic component 21, the conductive pillars 23 and the conductors 230, with the plate 24 of the conductive frame 2a exposed from the first encapsulation layer 25.

In an embodiment, the first encapsulation layer 25 includes a first surface 25a and a second surface 25b. The first surface 25a is combined on top of the first side 20a of the carrier structure 20, and the plate 24 is exposed from the second surface 25b of the first encapsulation layer 25.

In an embodiment, the first encapsulation layer 25 can be formed of PI, a dry film, an epoxy resin, or a molding compound, but the present disclosure is not limited to these.

Figure 2D:
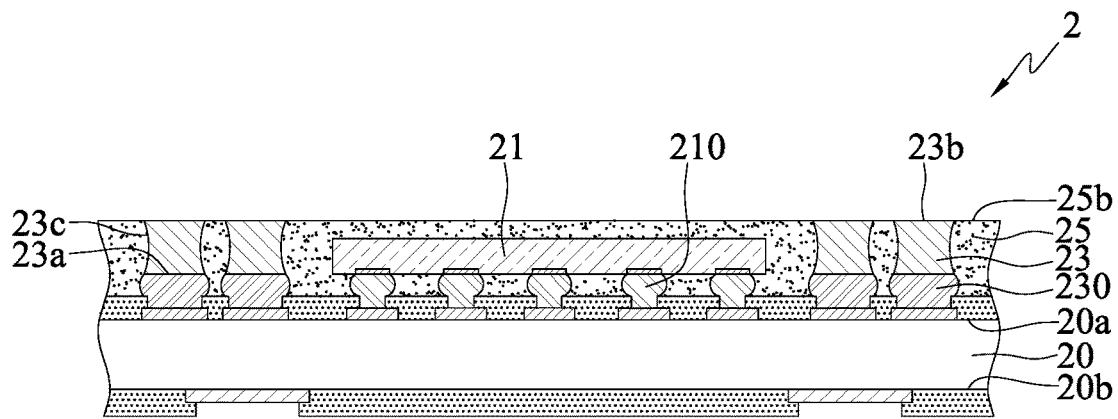

As shown in FIG. 2D, planarization is performed to remove the plate 24 of the conductive frame 2a and a portion of the first encapsulation layer 25, such that the end faces 23b of the conductive pillars 23 and the second surface 25b of the first encapsulation layer 25 are co-planar, allowing the end faces 23b of the conductive pillars 23 to be exposed from the second surface 25b of the first encapsulation layer 25.

In an embodiment, a method such as polishing, etching, cauterization, cutting, or any other appropriate method can be used to remove the plate 24 and a portion of the first encapsulation layer 25 in order to expose the end faces 23b of the conductive pillars 23 from the first encapsulation layer 25 for subsequent path arrangement of electrical circuits. In an embodiment, as shown in FIG. 2E, another electronic device 8 such as a packaging structure or a semiconductor chip is externally attached via conductive elements 80 (e.g., solder balls).

In an embodiment, the first encapsulation layer 25 was filled between the first electronic component 21 and the first side 20a of the carrier structure 20 to encapsulate the conductive bumps 210. In another embodiment, an underfill (not shown) can be first filled between the first electronic component 21 and the first side 20a of the carrier structure 20 to enclose the conductive bumps 210, and then the first encapsulation layer 25 is used to encapsulate the underfill.

Figure 2E:
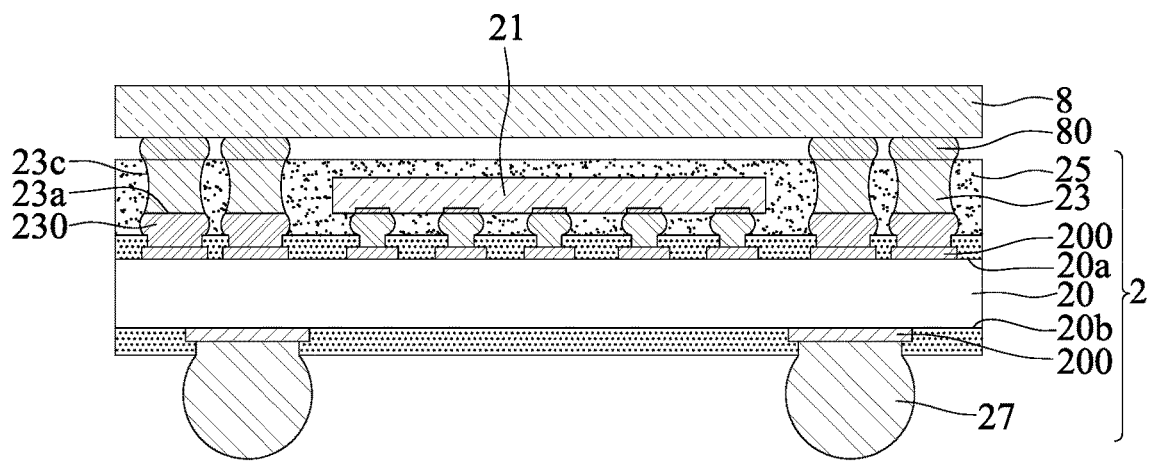

As shown in FIG. 2E, a plurality of conductive element 27 (e.g., solder balls) are attached onto the wiring layer 200 on the second side 20b of the carrier structure 20 for subsequent connection with a circuit board (not shown).

Figure 3A:
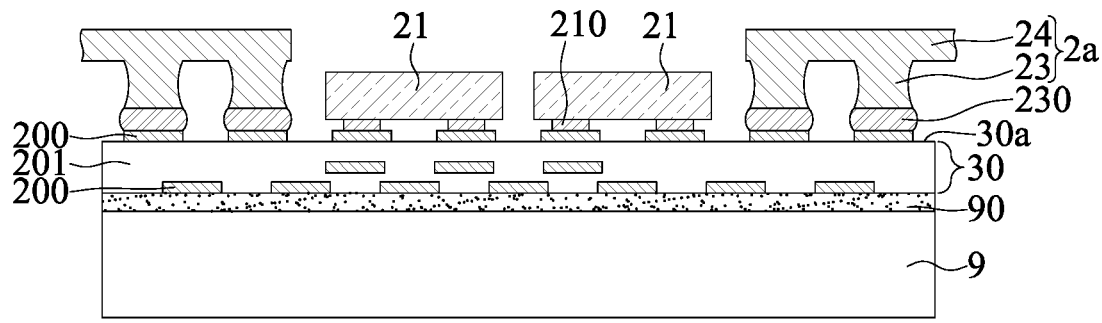
FIGS. 3A to 3C are cross-sectional schematic diagrams depicting a method for fabricating an electronic package in accordance with a second embodiment of the present disclosure.
Figure 3B:
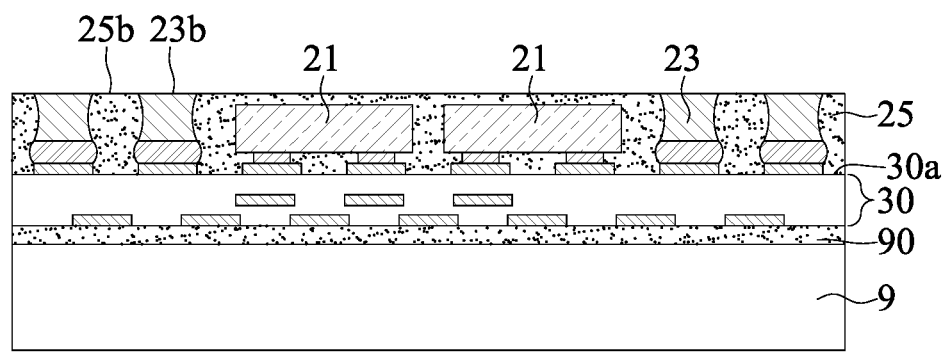
Figure 3C:
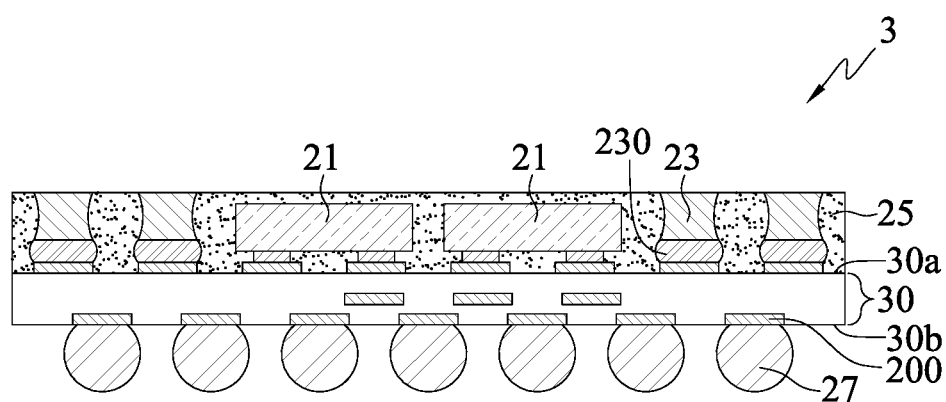

Referring to FIGS. 3A to 3C, cross-sectional schematic diagrams depicting a method for fabricating an electronic package 3 in accordance with a second embodiment of the present disclosure are shown. The second embodiment differs from the first embodiment in that a different kind of carrier structure 30 is provided.

As shown in FIG. 3A, an RDL process is performed on a support plate 9 to form a wiring portion, which is then used as the carrier structure 30. Then, a conductive frame 2a and a plurality of first electronic components 21 are provided on a first side 30a of the carrier structure 30.

In an embodiment, a release film 90 is provided on the support plate 9 to facilitate subsequent releasing of the carrier structure 30.

In an embodiment, the carrier structure 30 is a coreless packaging substrate with the wiring portion. The wiring portion includes at least one insulating layer 201 and a wiring layer 200 provided on the insulating layer 201.

As shown in FIG. 3B, a first encapsulation layer 25 is formed on the first side 30a of the carrier structure 30 to encapsulate the first electronic components 21 and the conductive pillars 23. Then, a planarization process is performed to expose the end faces 23b of the conductive pillars 23 from the second surface 25b of the first encapsulation layer 25.

As shown in FIG. 3C, the support plate 9 and the release film 90 are removed to expose a second side 30b of the carrier structure 30. Then, a plurality of conductive elements 27 (e.g., solder balls) are attached to the wiring layer 200 on the second side 30b of the carrier structure 30.

Figure 4A:
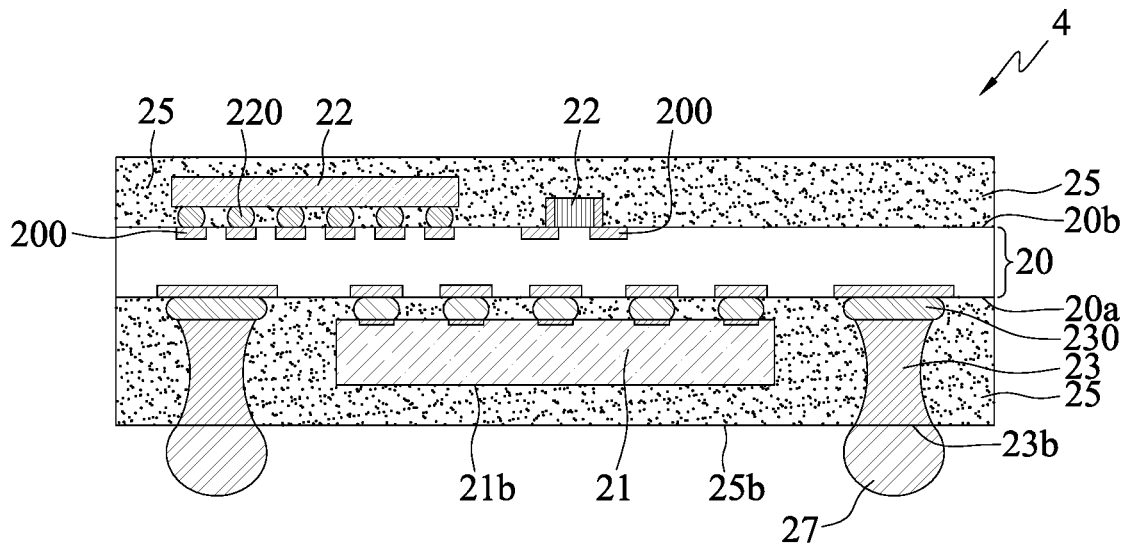
FIGS. 4A and 4B are cross-sectional schematic diagrams depicting a method for fabricating an electronic package in accordance with a third embodiment of the present disclosure.
Figure 4B:
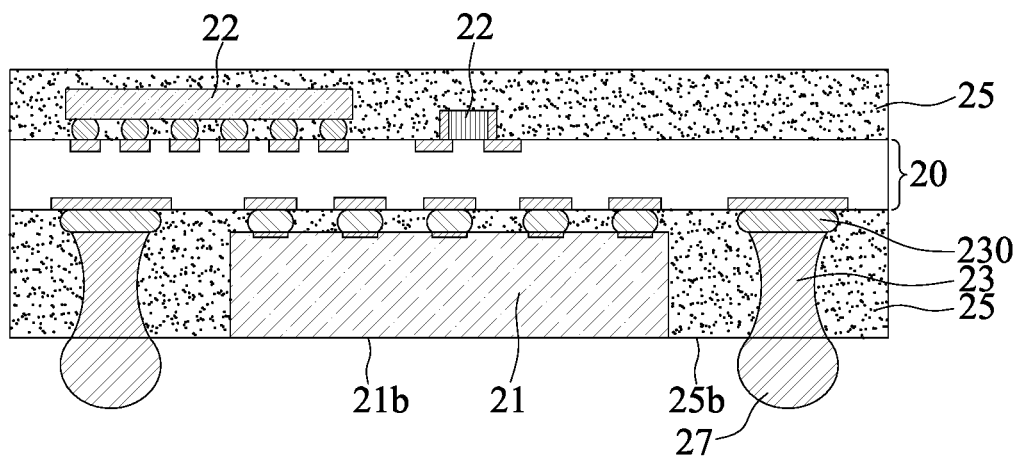

As shown in FIGS. 4A and 4B, cross-sectional schematic diagrams depicting a method for fabricating an electronic package 4 in accordance with a third embodiment of the present disclosure are shown. The third embodiment differs from the first and second embodiments in the layout at the second side 20b of the carrier structure 20.

As shown in FIG. 4A, before a first encapsulation layer 25 is formed, second electronic components 22 are provided on the second side 20b of the carrier structure 20, and then a double side molding process is performed in order to form the first encapsulation layer 25 on both the first side 20a and the second side 20b of the carrier structure 20 to encapsulate the first electronic component 21 and the second electronic components 22. Thereafter, a plurality of conductive elements (e.g., solder balls) are disposed on the exposed surfaces (end faces 23b) of the conductive pillars 23 for connecting an electronic device such as a circuit board.

In an embodiment, the second electronic components 22 can be active elements, passive elements, or a combination of both. In another embodiment, the active elements are semiconductor chips, and the passive elements are resistors, capacitors, or inductors. In an embodiment, the second electronic components 22 can be provided on the wiring layer 200 using the flip-chip method via a plurality of conductive bumps 220 (e.g., a solder material). In another embodiment, the second electronic components 22 can be electrically connected with the wiring layer 200 through a plurality of wires (not shown) by wire bonding. In yet another embodiment, the second electronic components 22 can be in direct contact with the wiring layer 200. However, the electrical connection between the second electronic components and the carrier structure is not limited to those described above.

In an embodiment, the non-active face 21b of the first electronic component 21 can be selectively not exposed from the second surface 25b of the first encapsulation layer 25, or, as shown in FIG. 4B, the non-active face 21b of the first electronic component 21 is exposed from the second surface 25b of the first encapsulation layer 25.

As shown in FIGS. 5A to 5D, cross-sectional schematic diagrams depicting a method for fabricating an electronic package 5 in accordance with a fourth embodiment of the present disclosure are shown. The fourth embodiment differs from the third embodiment in the structure and manufacturing steps of the conductive frame.

Figure 5A:
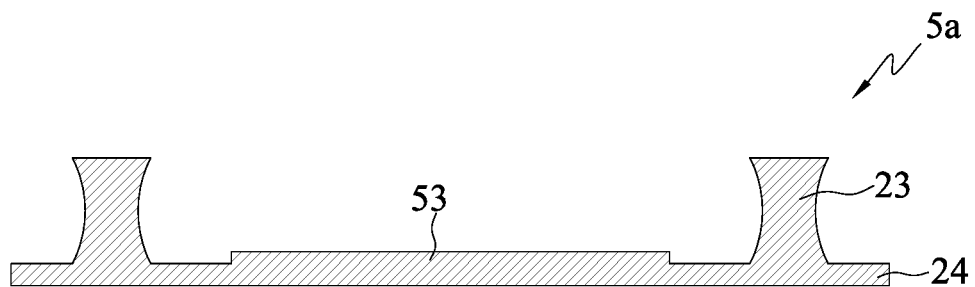
FIGS. 5A to 5D are cross-sectional schematic diagrams depicting a method for fabricating an electronic package in accordance with a fourth embodiment of the present disclosure, wherein FIG. 5D' is another alternative of FIG. 5D.

As shown in FIG. 5A, a conductive frame 5a includes a plate 24, a plurality of conductive pillars 23 discretely formed on the plate 24, and at least one bonding pad 53.

In an embodiment, the plate 24, the conductive pillars 23 and the bonding pad 53 are formed integrally. In an embodiment, a portion of a metal plate is removed by etching, laser, or other methods to form the conductive frame 5a.

Figure 5B:
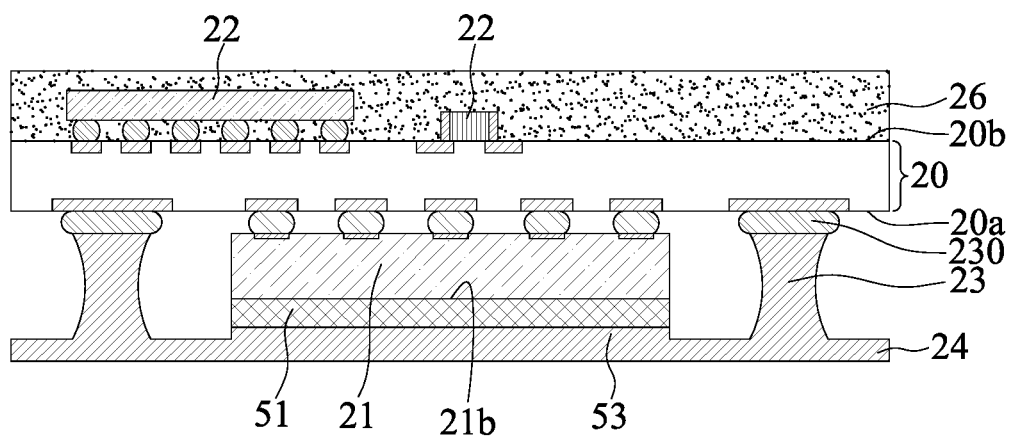

As shown in FIG. 5B, the conductive frame 5a is provided on the first side 20a of the carrier structure 20 via its conductive pillars 23 and conductors 230, and the non-active face 21b of the first electronic component 21 can be bonded to the bonding pad 53 through a bonding layer 51, and the bonding pad 53 is used for heat dissipation.

In an embodiment, the bonding layer 51 is a thin film, an epoxy resin, or a thermal interface material (TIM).

In an embodiment, second electronic components 22 are provided on the second side 20b of the carrier structure 20, and, before a first encapsulation layer 55 is formed, a second encapsulation layer 26 is formed on the second side 20b of the carrier structure 20 to encapsulate the second electronic components 22. In an embodiment, the second encapsulation layer 26 is made of PI, a dry film, an epoxy resin, or a molding compound.

Figure 5C:
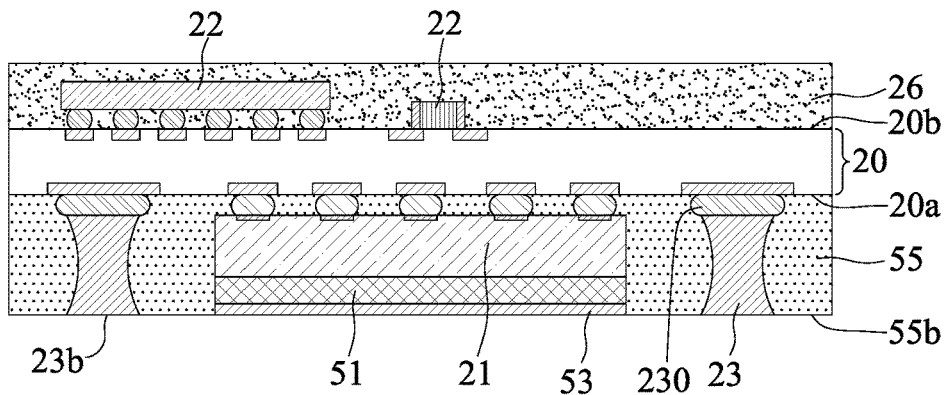

As shown in FIG. 5C, the first encapsulation layer 55 is formed between the first side 20a of the carrier structure 20 and the plate 24, such that the first encapsulation layer 55 encapsulates the first electronic component 21, the bonding layer 51, the bonding pad 53, the conductors 230, and the conductive pillars 23. Thereafter, the plate 24 is removed, such that the end faces 23b of the conductive pillars 23 and the bonding pad 53 are exposed from a second face 55b of the first encapsulation layer 55.

In an embodiment, the first encapsulation layer 55 and the second encapsulation layer 26 are made of the same material (not shown). In another embodiment, the first encapsulation layer 55 and the second encapsulation layer 26 are made of different materials, as shown in FIG. 5C. In an embodiment, the first encapsulation layer 55 and the second encapsulation layer 26 are formed simultaneously.

Figure 5D:
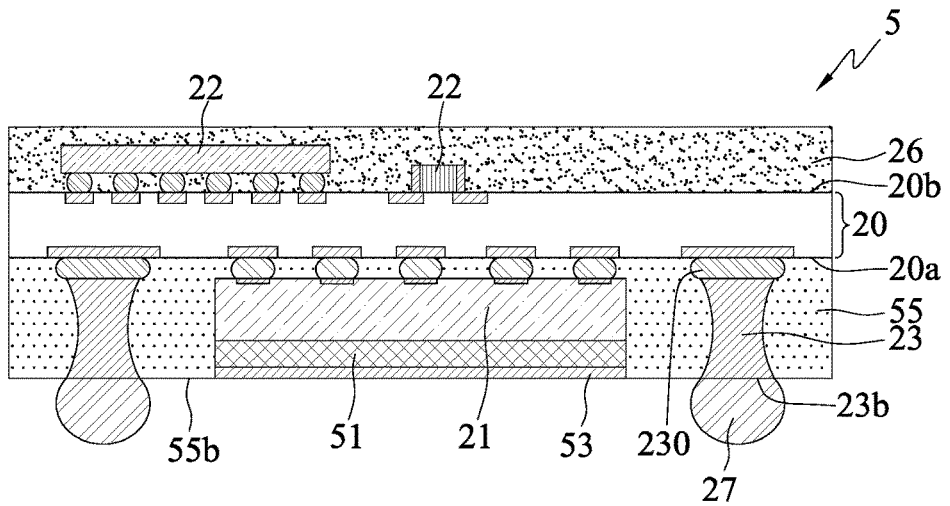
Figure 5D:
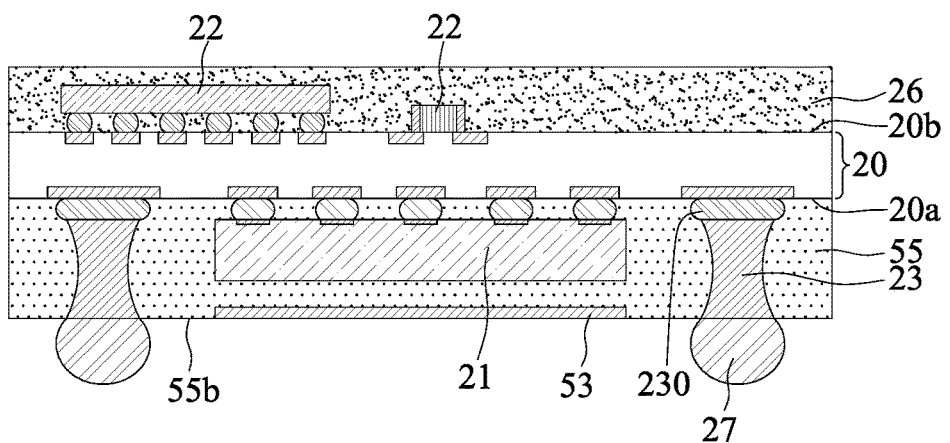

As shown in FIG. 5D, a plurality of conductive elements 27 (e.g., solder balls) are disposed on the end faces 23b of the conductive pillars 23 for connecting with an electronic device (not shown), such as a circuit board.

In an embodiment, depending on the heat dissipation requirement, the bonding layer 51 between the first electronic component 21 and the bonding pad 53 may be eliminated, such as that shown in FIG. 5D'.

In an embodiment, the surface of the bonding pad 53 can be made flush (co-planar) with the second surface 55b of the first encapsulation layer 55, such that the bonding pad 53 is exposed from the second face 55b of the first encapsulation layer 55, as shown in FIG. 5D. In another embodiment, an opening (not shown) is formed in second face 55b of the first encapsulation layer 55 and the bonding pad 53 is exposed from the opening.

Figure 6A:
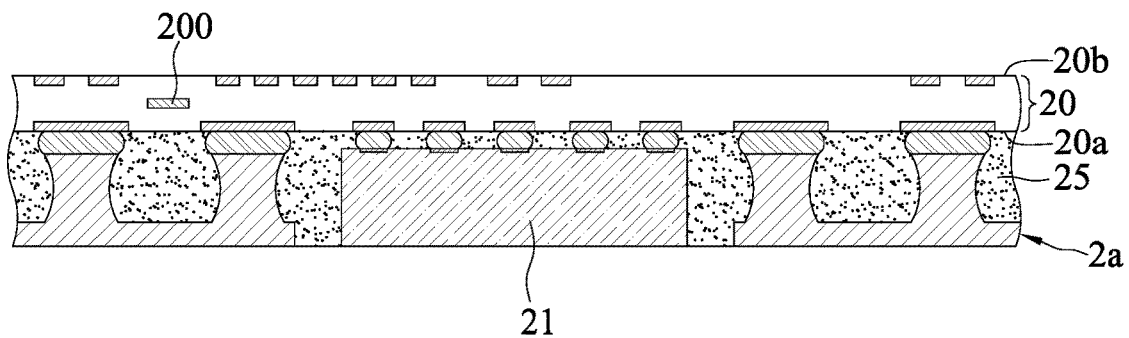
FIGS. 6A to 6E are cross-sectional schematic diagrams depicting a method for fabricating an electronic package in accordance with a fifth embodiment of the present disclosure, wherein FIG. 6C' is another alternative of FIG. 6C.
Figure 6B:
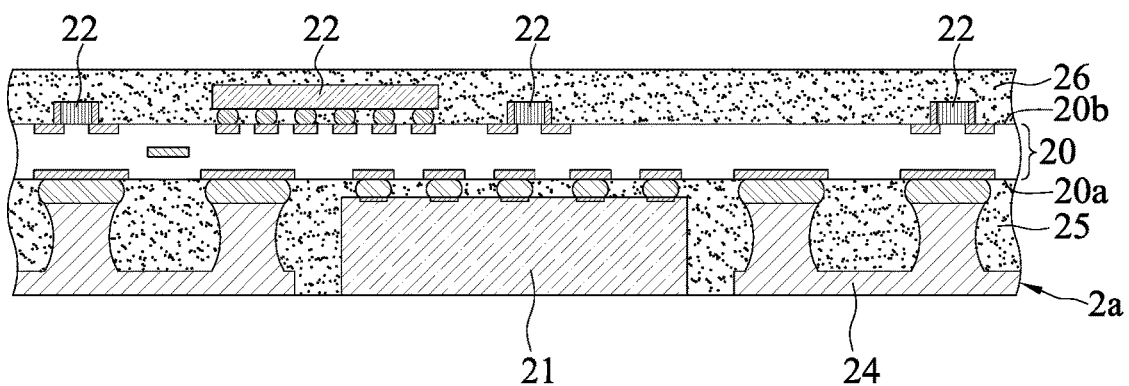
Figure 6C:
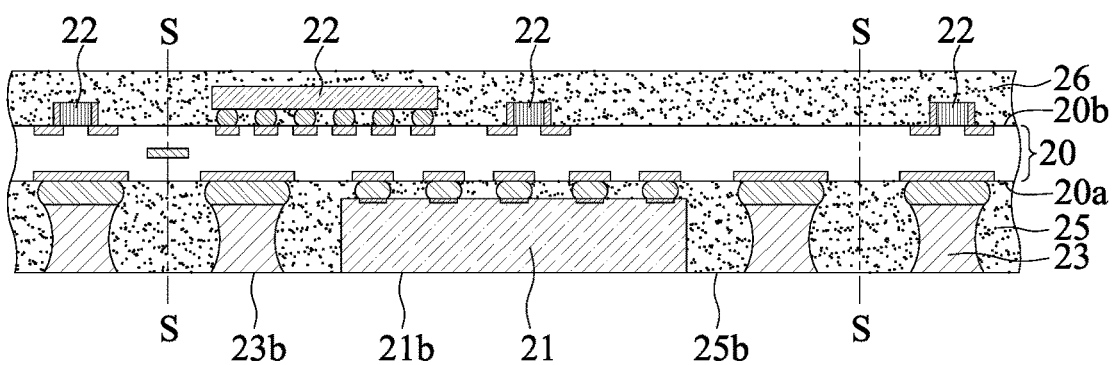
Figure 6C:
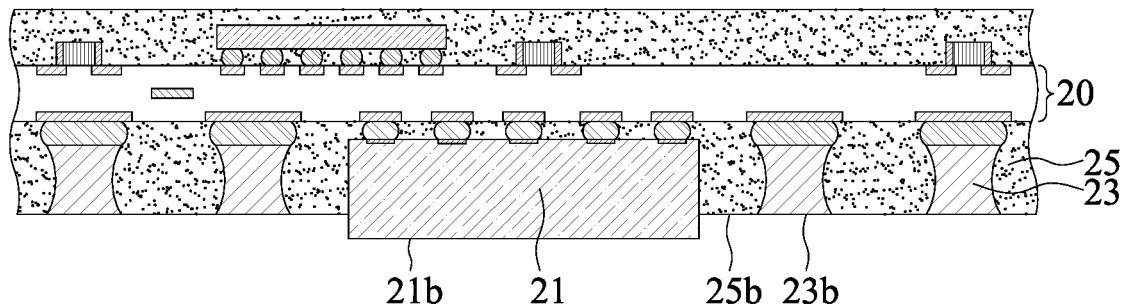
Figure 6D:
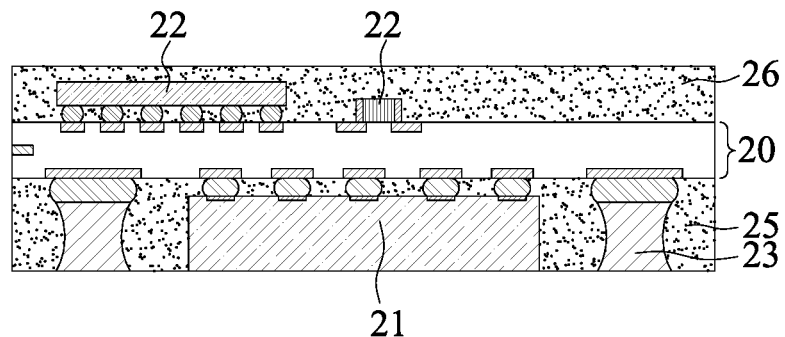
Figure 6E:
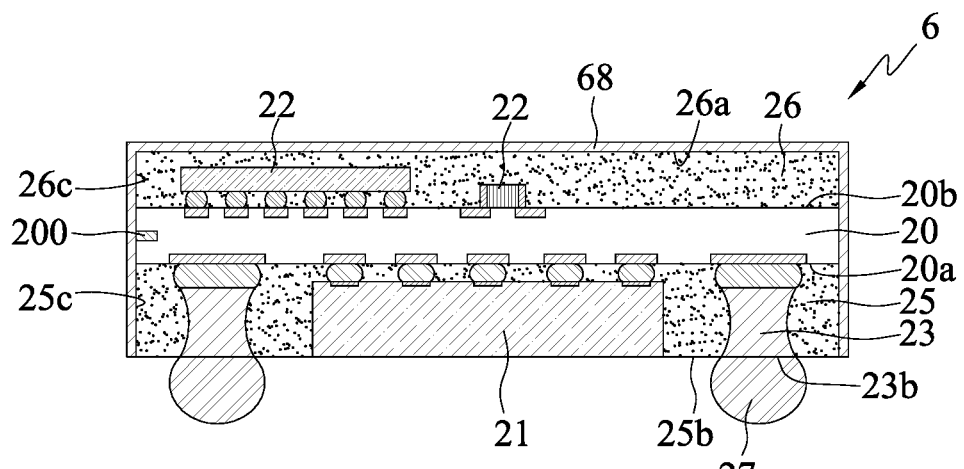

As shown in FIGS. 6A and 6E, cross-sectional schematic diagrams depicting a method for fabricating an electronic package 6 in accordance with a fifth embodiment of the present disclosure are shown. The fifth embodiment differs from the fourth embodiment in the sequence of the steps for forming the first and second encapsulation layers 25 and 26.

As shown in FIG. 6A, a structure is provided equivalent to the one obtained from the manufacturing step described with respect to FIG. 2C, i.e., the first encapsulation layer 25 is formed on the first side 20a of the carrier structure 20.

As shown in FIG. 6B, second electronic components 22 are provided on the second side 20b of the carrier structure 20, and a second encapsulation layer 26 is then formed on the second side 20b of the carrier structure 20 to encapsulate the second electronic components 22 of the second encapsulation layer 26.

In an embodiment, the first encapsulation layer 25 and the second encapsulation layer 26 are made of the same material. In another embodiment, the first encapsulation layer 25 and the second encapsulation layer 26 are made of different materials.

As shown in FIG. 6C, a planarization process is performed to remove the plate 24, a portion of the first encapsulation layer 25, and a portion of the first electronic component 21, such that the end faces 23b of the conductive pillars 23 are flush (co-planar) with the second surface 25b of the first encapsulation layer 25.

In an embodiment, planarization is performed by cutting off in one piece. In another embodiment, as shown in FIG. 6C', the plate 24, a portion of the second surface 25b of the first encapsulation layer 25 are etched away, and then a portion of the non-active face 21b of the first electronic component 21 is removed by polishing to allow the non-active face 21b of the first electronic component 21 to be flush (co-planar) with the second surface 25b of the first encapsulation layer 25 (as shown in FIG. 6C).

As shown in FIG. 6D, a singulation process is performed along a cutting path S shown in FIG. 6C.

As shown in FIG. 6E, a shielding element 68 is formed on a top side 26a and side faces 26c of the second encapsulation layer 26 and side faces 25c of the first encapsulation layer 25, such that the shielding element 68 is in contact and electrically connected with the wiring layer 200 of the carrier structure 20 to prevent the first electronic component 21 and the second electronic components 22 from electromagnetic interference.

In an embodiment, the shielding element 68 is made by sputtering, vaporing, electroplating, chemical plating, foiling, etc.

In an embodiment, a plurality of conductive element 27 (e.g., solder balls) are attached onto the end faces 23b of the conductive pillars 23 for subsequent connection with an electronic device (not shown) such as a circuit board or another wiring board.

Figure 7A:
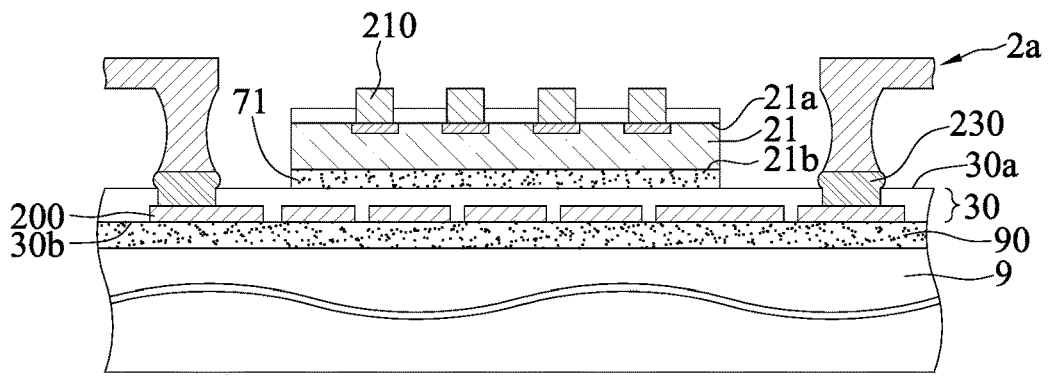
FIGS. 7A to 7C are cross-sectional schematic diagrams depicting a method for fabricating an electronic package in accordance with a sixth embodiment of the present disclosure.
Figure 7B:
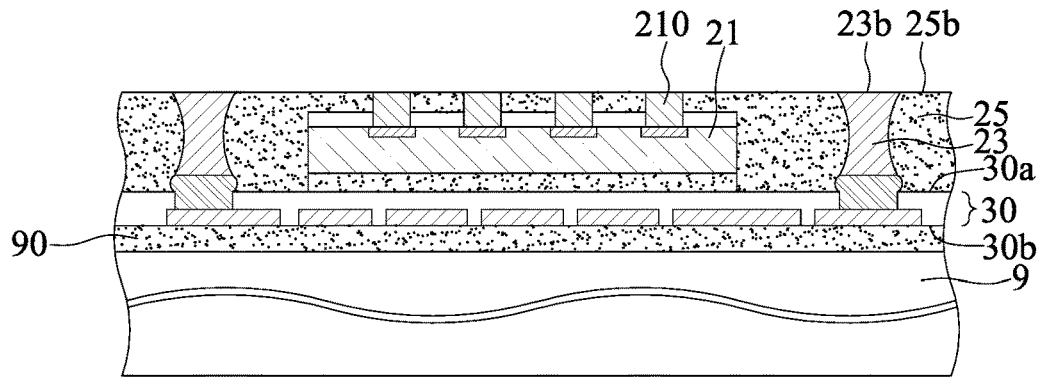
Figure 7C:
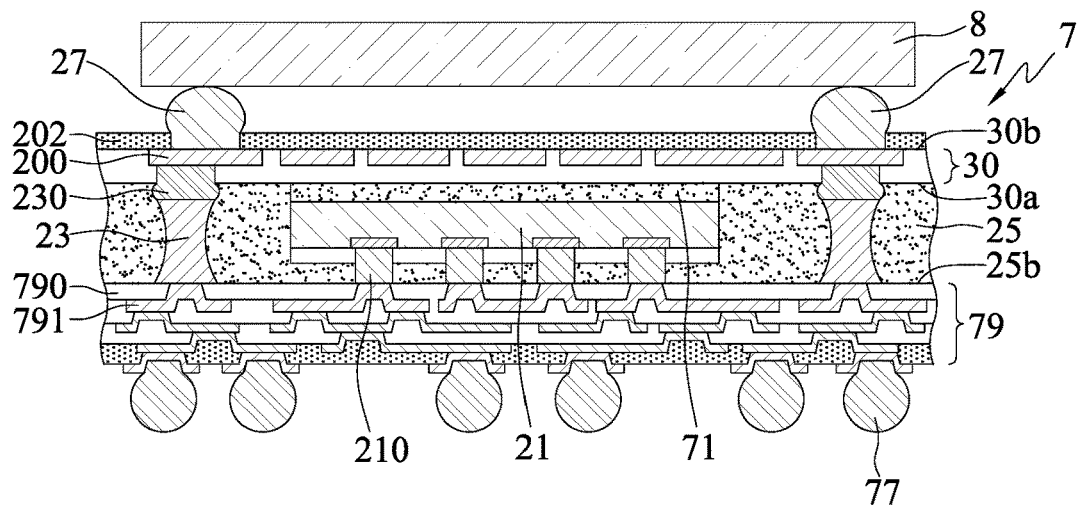

As shown in FIGS. 7A to 7C, cross-sectional schematic diagrams depicting a method for fabricating an electronic package 7 in accordance with a sixth embodiment of the present disclosure are shown. The sixth embodiment differs from the second embodiment in the manner that the first electronic component 21 is provided.

As shown in FIG. 7A, a non-active face 21b of a first electronic component 21 is bonded to a first side 30a of a carrier structure 30 via an adhesive layer 71, and a plurality of conductive bumps 210 are provided on the first surface 21a of the first electronic component 21. A conductive frame 2a is provided on the first side 30a of the carrier structure 30.

As shown in FIG. 7B, a first encapsulation layer 25 is formed on the first side 30a of the carrier structure 30, and a planarization process is performed, such that the conductive bumps 210 of the first electronic component 21 and the end faces 23b of the conductive pillars 23 are exposed from the second surface 25b of the first encapsulation layer 25.

As shown in FIG. 7C, a wiring structure 79 is formed on the second surface 25b of the first encapsulation layer 25, and the wiring structure 79 is electrically connected with the conductive pillars 23 and the first electronic component 21. In an embodiment, a support plate 9 and a release film 90 are removed to expose the second side 30b of the carrier structure 30.

In an embodiment, the wiring structure 79 includes a plurality of dielectric layers 790 and a plurality of RDLs 791 on the dielectric layers 790. One of the RDL 791 is electrically connected with the conductive pillars 23 and the conductive bumps 210 of the first electronic component 21. The RDLs 791 can be made of copper, for example. The dielectric layers 790 can be made of PBO, PI or prepreg (PP).

In an embodiment, a plurality of conductive elements 77 (e.g., solder balls) are attached onto the outermost layer of the RDLs 791 for subsequent connection with an electronic device (not shown) such as a packaging structure or another structure (e.g., another package or chip).

In an embodiment, a solder resist layer 202 is formed on the second side 20b if needed, and a plurality of conductive elements 27 (e.g., solder balls) are attached onto the wiring layer 200 on the second side 20b of the carrier structure 20 for subsequent connection with an electronic device 8, such as a packaging structure or a semiconductor chip.

In conclusion, the method for fabricating an electronic package according to the present disclosure uses the conductive pillars 23 of the conductive frame 2a, 5a, instead of traditional solder balls, and the pitch between the conductive pillars 23 can be adjusted according to need. Thus, compared to the prior art, the present disclosure will not suffer from bridging across the conductive pillars 23, thus improving product yield and reliability and satisfying the need for fine pitch.

Furthermore, the conductive frame 2a, 5a according to the present disclosure is formed by removing a portion of a metal plate to form the recesses 240 that separate the conductive pillars 23. The conductive frame 2a, 5a is then provided on the carrier structure 20, 30. Thus, compared to the prior art, the fabricating method according to the present disclosure obtains conductive pillars 23 of uniform height, resulting in good co-planarity of the grid array formed by the conductive pillars 23, thereby eliminating contact offsets in the subsequent manufacturing process.

In addition, the conductive pillar 23 has two opposite end faces 23a and 23b and a peripheral surface 23c adjoining the two end faces 23a and 23b. The width of the peripheral surface 23c is less than the width of the end faces 23a and 23b in that the sidewalls of the conductive pillars 23 curve inwards to accommodate the first encapsulation layer 25, 55, so that the first encapsulation layer 25, 55 can be held in place better around the conductive pillars 23. The fabricating method according to the present disclosure avoids delamination in the subsequent process due to poor bonding between the first encapsulation layer 25, 55 and the conductive pillars 23.

The present disclosure further includes an electronic package 2, 3, 4, 5, 6, 7, including: a carrier structure 20, 30, first and second electronic components 22, a plurality of conductive pillars 23, and first and second encapsulation layers 25, 55, 26.

The carrier structure 20, 30 includes a first side 20a, 30a and a second side 20b, 30b opposite to the first side 20a, 30a.

The first electronic component 21 and the second electronic components 22 are provided on the first side 20a, 30a and the second side 20b, 30b of the carrier structure 20, 30, respectively, and electrically connected with the carrier structure 20, 30.

The conductive pillars 23 are provided on the first side 20a, 30 of the carrier structure 20, 30. Each of the conductive pillars 23 includes two opposite end faces 23a and 23b and a peripheral surface 23c adjoining the two end faces 23a and 23b, and the width of the peripheral surface 23c is less than the width W of the two end faces 23a and 23b.

The first encapsulation layer 25, 55 encapsulates the first electronic component 21 and the conductive pillars 23.

The second encapsulation layer 26 encapsulates the second electronic components 22.

In an embodiment, the conductive pillars 23 are electrically connected with the carrier structure 20, 30.

In an embodiment, the conductive pillars 23 are bonded to the carrier structure 20, 30 via conductors 230.

In an embodiment, the first encapsulation layer 25 includes a first surface 25a and a second surface 25b opposite to the first surface 25a, and the first surface 25a is combined onto the first side 20a of the carrier structure 20, such that a portion of a surface (non-active face 21b) of the first electronic component 21 is exposed from the second surface 25b of the first encapsulation layer 25.

In an embodiment, the electronic package 5 further includes a bonding pad 53 embedded in the first encapsulation layer 55 at a location corresponding to the location of the first electronic component 21 and partially exposed from the second face 55b of the first encapsulation layer 55.

In an embodiment, the electronic package 6 further includes a shielding element 68 for shielding the first electronic component 21 and the second electronic components 22.

In an embodiment, the electronic package 7 further includes a wiring structure 79 provided on the second surface 25b of the first encapsulation layer 25 and electrically connected with the conductive pillars 23 and the first electronic component 21.

In summary, the electronic package and the method for fabricating the same according to according the present disclosure allow the pitch of the conductive pillars to be adjusted according to the need to prevent bridging across the conductive pillars from occurring, thereby raising product yield and reliability and satisfying the need for fine pitch.

Furthermore, the conductive frame is first formed before it is attached onto the carrier structure. Thus, compared to the prior art, the method for fabricating the electronic package according to the present disclosure is capable of obtaining conductive pillars of uniform height, resulting in good co-planarity of the grid array formed by the conductive pillars, thereby eliminating contact offsets in the subsequent manufacturing process.

In addition, the conductive pillar has two opposite end faces and a peripheral surface adjoining the two end faces, and the width of the peripheral surface is less than the width of the end faces in that the sidewalls of the conductive pillars curve inwards to accommodate the first encapsulation layer, thus providing better bonding. Therefore, the method for fabricating the electronic package according to the present disclosure avoids delamination in the subsequent process due to poor bonding between the first encapsulation layer and the conductive pillars.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
    a carrier structure;
    at least one electronic component provided on and electrically connected with the carrier structure;
    a plurality of conductive pillars provided on the carrier structure via a plurality of conductors of solder material, wherein the conductive pillars each include two opposite end faces and a peripheral surface adjoining the two end faces and being narrower than the two end faces, and the peripheral surface is curved inwards with respect to the two end faces such that the peripheral surface forms a concave arc; and
    at least one encapsulation layer encapsulating the electronic component and the conductive pillars, wherein the encapsulation layer includes a first surface and a second surface, the first surface is combined with the carrier structure, and the two end faces of the conductive pillars are free from protruding from the second surface of the encapsulation layer.

2. The electronic package of claim 1, wherein the conductive pillars are electrically connected with the carrier structure.

3. The electronic package of claim 1, wherein the carrier structure includes a first side and a second side opposite to the first side, with a plurality of electronic components provided on at least one of the first side and the second side.

4. The electronic package of claim 1, wherein the carrier structure includes a first side and a second side opposite to the first side, with a plurality of encapsulation layers provided on at least one of the first side and the second side.

5. The electronic package of claim 1, wherein a portion of a surface of the electronic component is exposed from a surface of the encapsulation layer.

6. The electronic package of claim 1, further comprising a bonding pad embedded in the encapsulation layer at a location corresponding to a location of the electronic component and at least partially exposed from a surface of the encapsulation layer.

7. The electronic package of claim 1, further comprising a shielding element shielding the electronic component.

8. The electronic package of claim 1, further comprising a wiring structure provided on the encapsulation layer and electrically connected with at least one of the conductive pillars and the electronic component.

9. A method for fabricating an electronic package, comprising:
    providing a conductive frame including a plate and a plurality of conductive pillars connected with the plate, wherein the conductive pillars each include two opposite end faces and a peripheral surface adjoining the two end faces and being narrower than the two end faces, and the peripheral surface is curved inwards with respect to the two end faces such that the peripheral surface forms a concave arc;
    bonding onto a carrier structure at least one electronic component and the conductive frame via the conductive pillars;
    encapsulating the electronic component and the conductive pillars with at least one encapsulation layer; and
    removing an entirety of the plate of the conductive frame.

10. The method of claim 9, further comprising electrically connecting the conductive pillars with the carrier structure.

11. The method of claim 9, further comprising bonding the conductive pillars onto the carrier structure via a plurality of conductors.

12. The method of claim 9, wherein the conductive frame is formed by removing a portion of a metal plate to form recesses separating the conductive pillars.

13. The method of claim 9, wherein the carrier structure includes a first side and a second side opposite to the first side, with a plurality of electronic components provided on the first side and the second side.

14. The method of claim 9, wherein the carrier structure includes a first side and a second side opposite to the first side, with a plurality of encapsulation layers provided on the first side and the second side.

15. The method of claim 9, wherein a portion of a surface of the electronic component is exposed from a surface of the encapsulation layer.

16. The method of claim 9, wherein the conductive frame further includes a bonding pad disposed at a location corresponding to a location of the electronic component and at least partially exposed from the encapsulation layer.

17. The method of claim 9, further comprising forming a shielding element shielding the electronic component.

18. The method of claim 9, further comprising, after removing the plate, forming on the encapsulation layer a wiring structure electrically connected with the conductive pillars.

19. The method of claim 9, further comprising, after removing the plate, forming on the encapsulation layer a wiring structure electrically connected with the electronic component.

* * * * *